United States Patent [19]
Hodes et al.

[11] Patent Number: 4,832,809
[45] Date of Patent: * May 23, 1989

[54] PROCESS FOR PREPARATION LAYERED COMPOSITE CONSTRUCTIONAL MATERIAL, ESPECIALLY FOR SLIDING AND FRICTION MEMBERS

[75] Inventors: Erich Hodes, Rosbach; Klaus Goerke, Jugenheim, both of Fed. Rep. of Germany

[73] Assignee: Glyco-Metall-Werke Daelan & Loos GmbH, Wiesbaden, Fed. Rep. of Germany

[*] Notice: The portion of the term of this patent subsequent to May 16, 2006 has been disclaimed.

[21] Appl. No.: 2,647

[22] Filed: Jan. 12, 1987

[30] Foreign Application Priority Data

Jan. 20, 1986 [DE] Fed. Rep. of Germany ....... 3601439

[51] Int. Cl.$^4$ ............................................. C23C 14/34
[52] U.S. Cl. ........................... 204/192.15; 204/192.16; 204/192.3
[58] Field of Search ...................... 204/192.12, 192.15, 204/192.16, 192.2, 192.3; 428/615, 645, 646, 647, 649, 660, 680, 687; 384/912

[56] References Cited

U.S. PATENT DOCUMENTS

| | | | |
|---|---|---|---|
| 4,035,208 | 7/1977 | Fuller et al. | 204/192.15 X |
| 4,140,592 | 2/1979 | Orlando | 204/192.15 X |
| 4,245,008 | 1/1981 | Michaelsen et al. | 428/611 |
| 4,290,876 | 9/1981 | Nishiyama et al. | 204/192.15 X |
| 4,336,118 | 6/1982 | Patten et al. | 204/192.12 |
| 4,342,632 | 8/1982 | Heim et al. | 204/192.16 |
| 4,363,854 | 12/1982 | Hodes et al. | 428/632 |
| 4,404,263 | 9/1983 | Hodes et al. | 428/564 |
| 4,448,854 | 5/1984 | Schuller et al. | 428/611 |
| 4,552,820 | 11/1985 | Lin et al. | 428/611 |
| 4,562,122 | 12/1985 | Hodes et al. | 428/644 |
| 4,591,536 | 5/1986 | Hodes et al. | 428/643 |

FOREIGN PATENT DOCUMENTS

| | | |
|---|---|---|
| 144572 | 6/1985 | European Pat. Off. . |
| 144838 | 6/1985 | European Pat. Off. . |
| 2853724 | 7/1981 | Fed. Rep. of Germany . |
| 2914618 | 9/1983 | Fed. Rep. of Germany . |

*Primary Examiner*—Nam X. Nguyen
*Attorney, Agent, or Firm*—H. Gibner Lehmann; K. Gibner Lehmann

[57] ABSTRACT

A layered composite construction material, especially for sliding and friction elements, with a substrate, for example a steel layer, on which is a copper-containing or a tin-containing intermediate layer and then a tin-containing or copper-containing functional layer, together with an interposed diffusion barrier layer. Diffusion of tin between the functional and intermediate layers is minimized by forming the diffusion barrier layer by cathode sputtering of a metallic material which has essentially a cubic face-centered crystal lattice that is built up under a recrystallization process. Vacancy sites in the crystal lattice structure are avoided or removed, and a space filling of from 60% to the optimum 68% is achieved. Preferably the diffusion barrier layer is a nickel-tin alloy having a tin content of at least 10% by weight.

11 Claims, 1 Drawing Sheet

PROCESS FOR PREPARATION LAYERED COMPOSITE CONSTRUCTIONAL MATERIAL, ESPECIALLY FOR SLIDING AND FRICTION MEMBERS

CROSS REFERENCES TO RELATED APPLICATIONS

1. Copending application of Erich Hodes and Klaus Goerke, U.S. Ser. No. 2,448 filed Jan. 12, 1987 and entitled COMPOSITE STRUCTURAL MATERIAL WITH DIFFUSION BARRIER LAYER, ESPECIALLY FOR SLIDE AND FRICTION MEMBERS, AND METHOD OF MANUFACTURE, now allowed.

2. Copending application of Erich Hodes and Klaus Goerke, U.S. Ser. No. 5,434 filed Jan. 12, 1987 and entitled SLIDING OR FRICTIONAL MEMBER HAVING ITS FUNCTIONAL COMPONENT MADE FROM A CERAMIC MATERIAL WITH INCORPORATED STABILIZER, AND PROCESS FOR MANUFACTURE OF THE SAME, now abandoned.

3. Copending application of Erich Hodes and Klaus Goerke, U.S. Ser. No. 2,554 filed Jan. 12, 1987 and entitled PROCESS FOR THE PREPARATION OF LAYER COMPONENTS BY SPUTTERING AT LEAST ONE METALLIC MATERIAL ONTO A METALLIC SUBSTRATE, now abandoned.

4. Copending application of Erich Hodes and Klaus Goerke, U.S. Ser No. 2,447 filed Jan. 12, 1987 and entitled SLIDING OR FRICTIONAL MEMBER WITH ITS FUNCTIONAL COMPONENT MADE FROM A CERAMIC MATERIAL, now abandoned.

STATEMENT AS TO RIGHTS TO INVENTION MADE UNDER FEDERALLY-SPONSORED RESEARCH AND DEVELOPMENT.

Research and development of the present invention and application have not been Federally-sponsored, and no rights are given under any Federal program.

BACKGROUND OF THE INVENTION

1. FIELD OF THE INVENTION

The invention relates to a layered composite construction material, especially materials intended for sliding and friction elements, in which there is applied to a substrate, for example a steel layer, an intermediate layer containing copper and/or tin, and on the latter but separated therefrom by a diffusion barrier layer, there is applied a functional layer, as for example a frictional or sliding layer which contains tin and/or copper. In such materials the diffusion barrier layer can be about 0.5 to 5 um thick, and can consist of a metallic substance which exists in an essentially cubic face-centered crystal lattice.

2. DESCRIPTION OF THE RELATED ART INCLUDING INFORMATION DISCLOSED UNDER 37 CFR §§1.97-1.99

In known layered composite construction materials, for example those in accordance with German Offenlegungsschrift (Preliminary Published Patent) No. 2,853,724, there are provided an intermediate layer of a material having emergency running characteristics, for example lead bronze, and a superimposed functional layer, for example a sliding or frictional layer. It is recommended that a thin, oxide-free diffusion barrier layer be arranged between the intermediate layer and the functional sliding or frictional layer, in order to trap tin which migrates out of the sliding layer at elevated temperatures, thereby to avoid the formation of brittle intermetallic phases made of tin and the copper of the lead bronze. The latter, because of its brittle character, would give rise to a loosening of the sliding or frictional layer during dynamic stressing of a sliding or frictional element.

Therefore it is proposed in German Offenlegungsschrift No. 2,853,724 to provide, as the diffusion barrier layer between the intermediate layer and the sliding or frictional layer, a sputtered diffusion barrier layer made of $NiCr_{20}$ or pure chromium. As experience in practice has shown, however, the nickel-chromium diffusion barrier layer and also a pure chromium diffusion barrier layer are not completely effective with sliding or frictional layers which contain tin (e.g. those made of AlSn alloys). Investigations with the aid of the scanning electron microscope and the microprobe show that tin evidently diffuses via lattice vacancy sites through such a sputtered diffusion barrier layer made of $NiCr_{20}$ or pure tin, and combines with the copper of the lead bronze intermediate layer to give a brittle intermetallic phase, such as $Cu_6Sn_5$ which, under conditions similar to practical operation, leads to a loosening of the sliding layer and thus to failure of the bearing.

Galvanically applied diffusion barrier layers also have found in practice to exhibit a comparatively large number of lattice vacancy sites and therefore at elevated temperature they likewise allow tin to diffuse out of the functional, sliding or frictional layer, into the intermediate layer.

SUMMARY OF THE INVENTION

The object of the present invention, therefore, is to effect substantial improvements in layered composite construction materials of the kind indicated above, so that the diffusion of tin through the diffusion barrier layer is practically suppressed or at least substantially diminished.

This object is achieved, in accordance with the invention, by having the diffusion barrier layer formed by cathodic sputtering in vacuum, so as to provide a recrystallized structure free of lattice vacancy sites in the cubic face-centered crystal lattice.

By applying a diffusion barrier layer in accordance with the invention, which layer is made of a metallic material having essentially a cubic face-centered crystal lattice, with the aid of the cathodic vacuum sputtering process, loosening of the functional layer from the intermediate layer is dependably avoided, as experiments have surprisingly shown. It is true that thin layers of such metallic materials existing essentially as a cubic face-centered crystal lattice, can also be made by the galvanic route. However, it has been found that such galvanically applied thin layers are burdened to a large extent with vacancies in the crystal lattice, and therefore at elevated temperatures they allow tin to diffuse in considerable quantities from the functional layer into the intermediate layer.

BRIEF DESCRIPTION OF THE DRAWINGS

An example of an embodiment of the invention will be further explained below, using the drawing, wherein.

DESCRIPTION OF THE PREFERRED EMBODIMENT

Figure 1:
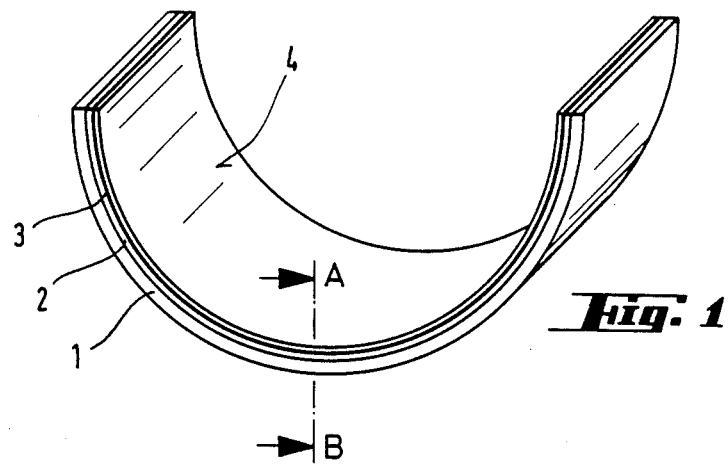
FIG. 1 shows a perspective representation of a slide-bearing bushing made from a layered composite material in accordance with the invention.
Figure 2:
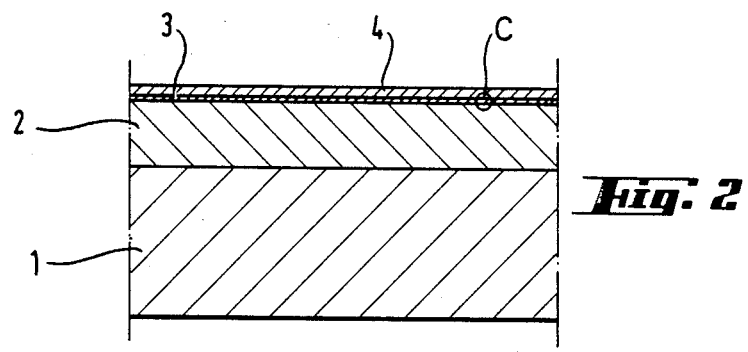
FIG. 2 shows an enlarged representation of a section A-B denoted in FIG. 1.

In a particularly advantageous embodiment of the invention, the diffusion barrier layer is formed by cathodic sputtering from a nickel-tin alloy having a tin content of at least 10% by mass. One might at first assume that the tin content of the material making up the diffusion barrier layer, and in particular a tin content of 20% by mass, and more, could tend to allow tin to move out of the diffusion barrier layer into the intermediate layer and then to supplement the tin content once more from the functional layer; that is, to permit an indirect diffusion of tin out of the functional layer into the intermediate layer. But in fact this initially expected effect does not take place. Rather, it has been found, surprisingly, that an alloy of nickel and tin with a tin content of at least 10% by mass develops an especially reliable barrier action for the tin between the functional layer and the intermediate layer.

The layered composite construction material of the invention can be prepared especially advantageously and favorably by the process in accordance with the invention, which is characterized in that the substrate, previously coated with the intermediate layer, is subjected to a cleaning or etching of the free surface of the intermediate layer by reverse cathodic sputtering in vacuum, and directly thereafter the diffusion barrier layer is applied by cathodic sputtering while maintaining successive conditions of the temperature of the substrate and the plasma pressure in the receiver which are adjusted corresponding to the structure of the diffusion barrier layer which is to be achieved. It has been found in this connection that, at the highest possible temperature at the surface to be coated, and the lowest possible plasma pressure in the receiver, the particles of material which are to be applied to the surface to be coated are of essentially atomic size, and are brought with high kinetic energy onto the surface to be coated. After impinging onto the surface to be coated, the applied particles or atoms still possess, on the average, a considerable mobility, so that at least in part, they again more or less detach themselves from the point of their impingement on the surface and, in the manner of a recrystallization process, they become incorporated into the texture which is characteristic of the material. The relatively high mobility of the particles or atoms leads to their assembly into a practically vacancy-free texture.

There is an upper limit on the temperature at the surface to be coated, which is set by the composition of the intermediate layer; that is, owing to the fact that components of the intermediate layer, for example lead, vaporize away above a threshold temperature. In the process in accordance with the invention, this limit can be dealt with by increasing the temperature of the substrate at the surface to be coated, during the formation of the diffusion barrier layer, when the diffusion barrier layer has reached the thickness of one or several atomic layers, and can thus oppose the vaporization of components of the intermediate layer. The mobility of the particles applied by the cathodic sputtering onto the surface of the intermediate layer which is to be coated is also maintained at a high level owing to the fact that the operation is conducted at the lowest possible plasma pressure in the receiver; the number of collisions of the cathode-sputtered particles with plasma particles is thereby kept low. On the other hand, if the plasma pressure is decreased too much, the abnormal glow discharge, which indeed represents the physical vehicle of cathodic sputtering, becomes so weak that the flow of electrical current, and hence the throughput efficiency of the cathodic sputtering, decreases excessively. It has been found, however, that the physical working conditions for cathodic sputtering can be set and mutually adjusted, before these limits are reached, such that the buildup of the diffusion barrier layer still proceeds in the manner of a recrystallization process.

A further improvement with respect to the density of the diffusion barrier layer that is to be formed can be achieved if, during the formation of the diffusion barrier layer, a negative electrical potential is applied to the substrate which is one order of magnitude lower than the negative electrical potential applied to the target. To be sure, one must always take into account the possibility that gas particles and other foreign substance particles could be incorporated into the texture of the diffusion barrier layer, and could form undesired vacancies there. In fact, however, this can be effectively suppressed by the joint effect of the high temperature maintained at the surface to be coated and the relatively low plasma pressure in the receiver.

The heating of the substrate to the temperature desired in the formation of the diffusion barrier layer can be carried out during the reverse cathodic sputtering used for the cleaning or etching of the free surface of the intermediate layer; in particular, this reverse cathodic sputtering itself can be used to produce the desired temperature at the substrate, either by itself or with the aid of other energy sources, for example infrared radiation or induction heating. The latter of these is less attractive if the cathodic sputtering is to be carried out in a magnetic field. One can also post-heat the substrate and the diffusion barrier layer being formed, during the course of the cathodic sputtering used to produce the diffusion barrier layer; this can be done, for example, by infrared irradiation of the side which is to be coated.

The application of the functional layer onto the diffusion barrier layer can likewise be carried out by cathodic sputtering, and in particular directly after the application of the diffusion barrier layer. Here it is possible not only to change over to the cathodic sputtering of another material, namely the material intended for the functional layer, but also to change over to other operating conditions, with respect to the electrical potential to be applied to the target and possibly the substrate, the plasma pressure to be maintained, and the composition of the plasma. In order to be able, simultaneously and in one receiver, to apply the diffusion barrier layer to one workpiece or portion of a workpiece, and also to apply the functional layer to another workpiece or portion of a workpiece, it is desirable to provide separators and air-locks within the receiver, through which the workpieces or a strip of material can be conveyed from one separated region of the receiver to another separated region of the receiver.

If the formation of the functional layer is to be carried out using a different plasma composition than the formation of the diffusion barrier layer, and the danger could exist that a plasma of another composition could have a disadvantageous effect on the freshly produced free surface of the diffusion barrier layer, the possibility is provided, within the scope of the process of the invention, that a thin protective layer, which covers the diffusion barrier layer, is first applied to the free surface of the latter using a plasma which has essentially the same composition as for the formation of the diffusion barrier layer, by cathodic sputtering or ionic plating; this protective layer can even be formed from the material intended for the functional layer.

For the formation of a diffusion barrier layer having a vacancy-free structure, it has been found particularly advantageous and useful if the target to be used for the formation of the diffusion barrier layer by cathodic sputtering, or the material contained in the target, is subjected to a pretreatment which causes a high degree of degassing, so that the target materials used for the formation of the diffusion barrier layer are notably depleted of gas. This particularly highly degassing pretreatment of the material or materials contained in the target to be used for the formation of the diffusion barrier layer can consist in a high vacuum fusion and/or a high vacuum annealing and/or a high vacuum distillation.

In the example represented, there is applied to a carrier layer 1 made of steel, or to a steel supporting shell, an intermediate layer 2 made of a copper-containing bearing material, for example lead bronze, at a layer thickness of about 0.2 mm to 0.7 mm. The copper-containing bearing material of the intermediate layer 2 has a composition within the usual limits customary for copper-containing bearing material in intermediate layers of multilayer slide bearings. A diffusion barrier layer is applied to the surface of the intermediate layer 2 which faces away from the carrier layer 1; in the example represented, this diffusion barrier layer can have a thickness of about 3 um. In the example represented, this diffusion barrier layer consists of a nickel-tin alloy having a tin content of 20% by mass. The diffusion barrier layer is applied by cathodic sputtering onto the free surface of the intermediate layer 2. The sliding layer 4 is applied to the free surface of the diffusion barrier layer 3 by cathodic sputtering in vacuum. The sliding layer 4 consists of tin-containing alloy or dispersion alloy. Among slide-bearing alloys for the sliding layer 4 there may be mentioned, for example, tin-based alloys, e.g. $SnSb_{12}Cu_6Pb_2$, or lead-based alloys with appreciable tin contents, e.g. $PbSn_{10}Cu_2$ or $PbSn_{10}$. The sliding layer 4 can, however, also be made of dispersion alloy, in particular those based on AlSn, in particular $AlSn_6$, $AlSn_{10}$, $AlSn_{20}$ or $AlSn_{40}$.

In any case, the tin contained in the sliding layer 4 norbine tends to diffuse into the intermediate layer 2 and to combine with the copper present there to form intermetallic phases, in particular brittle intermetallic phases such as $Cu_6Sn_5$, and to do so to an increasing extent as the operating temperature of the slide bearing becomes higher. The known diffusion barrier layers, especially galvanically applied diffusion barrier layers, can significantly obstruct the diffusion of tin at low temperatures. At higher operating temperatures, for example in the range of 200° C. and above, the tin diffuses out of the sliding layer into the copper-containing intermediate layer practically unimpeded by conventional diffusion barrier layers. This is explained inasmuch as vacancy sites are present in the crystal lattice of known diffusion barrier layers to such an extent that the tin atoms, which are more mobile owing to the elevated temperature, can pass directly through the diffusion barrier layer.

Figure 3:
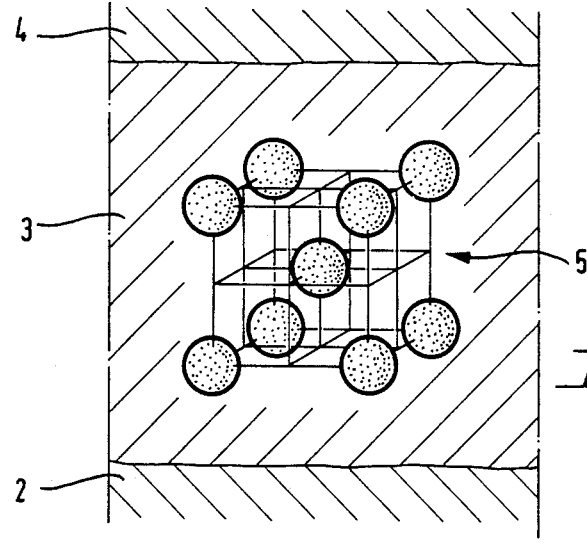
FIG. 3 shows the portion C of FIG. 2 in a still further enlarged representation, into which is inserted a schematic representation of the crystal lattice.

In contrast, with the sputtered diffusion barrier layer 3, a practically vacancy-free cubic face-centered crystal lattice is formed by recrystallization, as indicated in FIG. 3. Owing to the formation of the recrystallized and vacancy-free cubic face-centered crystal lattice, the nickel-tin alloy provided in the example represented here is still practically impermeable to diffusion tin even at temperatures in the range of 200° C. and above.

EXAMPLE

The layered composite material used in the example given, for the preparation of the slide-bearing bushing, is prepared in the following manner:

A steel carrier 1 coated in the customary manner with the intermediate layer 2 made of copper-containing bearing material is applied to a metallic support, which for example is shaped in the manner of a wagon and can be moved within a receiver (not shown) divided into chambers, as is used for cathodic sputtering. The support is equipped with a chamber through which liquid can be passed, which chamber is connected to a circulating arrangement for a liquid heating medium, for example, oil.

After placement in the receiver, the semi-finished part made up of the carrier layer 1 and the intermediate layer 2 is mounted on the support in a heat-conducting manner with the free surface of the intermediate layer 2 exposed, and is heated by adjustment of the temperature of the liquid heating medium, and at the same time degassed by evacuation of the receiver, until a pressure of about $10^{-5}$ mbar is achieved in the receiver.

Next after the degassing of the semi-finished part, plasma gas, preferably argon, is admitted to the receiver until a pressure of $5 \times 10^{-3}$ to $5 \times 10^{-2}$ is achieved. Next a cleaning and roughening of the free surface of the intermediate layer 2 is performed, in the form of an etching by reverse cathodic sputtering. For this purpose, the support is placed in an electrical circuit with the semi-finished piece mounted on it, as the cathode, and an abnormal glow discharge is produced, in which an etching voltage between 400 V and 1000 V, preferably at 500 V, is applied, and an etching current between 5 A and 15 A, or an etching current density between 5 and 15 $mA/cm^2$ on the surface to be etched, is maintained. During this reverse cathodic sputtering, a substrate temperature between 120° C. and 200° C., preferably 140° C., is achieved and maintained by the joint action of the liquid heating medium and the reverse cathodic sputtering. The duration of this etching treatment by reverse cathodic sputtering can be chosen according to the requirement of each individual case.

Following the etching by reverse cathodic sputtering, the diffusion barrier layer is applied by a cathodic sputtering. For this purpose, the support, still with its heating and cooling chamber connected to the heating medium circulating system, is connected into an electrical circuit as an anode, and a negative potential of about 30 to 70 V is applied. The diffusion barrier layer is then formed by cathodic sputtering of a target made of the material desired for the diffusion barrier layer, for example a target of nickel-tin alloy having a tin content of at least 10% (parts by mass), and preferably at least 20% (parts by mass). If it is desired to prepare the diffusion barrier layer from ferromagnetic material, for example pure nickel or nickel-tin alloy with a lower proportion of tin than 10% (parts by mass), special steps can be taken with regard to the magnetic field, for carrying out the cathodic sputtering, as are known, for example, from European Published Patent Applications Nos. 144,572 and 144,838.

During the build-up of the diffusion barrier layer, a potential difference of between 300 V and 700 V is maintained as the sputtering potential between the target and the substrate, i.e. the semi-finished piece made up of the carrier layer 1 and the intermediate layer 2. The sputtering current maintained during the build-up of the diffusion barrier layer in this example amounts to 50 to 150 A, or 10 to 30 W/cm² of the surface to be coated. The substrate, i.e. the semi-finished piece to be coated, is held at a temperature between 120° C. and 200° C., preferably at 140° C., during the build-up of the diffusion barrier layer by means of the liquid heat transfer medium conveyed to the support. In the present example, the temperature should be held as constant as possible, i.e. within limits of ±5° C. during the entire sputtering of the diffusion barrier layer. During the buildup of the diffusion barrier layer 3 by cathodic sputtering, the plasma pressure in the receiver is held in the range between $1 \times 10^{-3}$ to $5 \times 10^{-2}$ mbar. Under these conditions of temperature and pressure, a recrystallization process occurs within the diffusion barrier layer 3 as it forms, as a result of which it is assured that the cubic face-centered crystal lattice 5 is completely occupied. With this, the space filling in the crystal lattice is 60% to 68%, i.e. a filling of the crystal lattice which makes permeation by tin atoms practically impossible.

After the formation of the diffusion barrier layer 3, the functional or sliding layer 4 is formed under practically the same conditions in terms of sputtering voltage, sputtering current, substrate temperature and sputtering pressure, as already adjusted in the formation of the diffusion barrier layer, with the exception that the cathodic sputtering is done from a target or several targets having the particular material composition which is desired for the functional or sliding layer 4 in question. In addition, in building up the functional layer, oxidic components can be formed and can be incorporated as very fine particles for dispersion hardening in the functional layer, for example the sliding layer 4, as is known from German Pat. Nos. 2,853,724 and 2,914,618. The oxygen required for this can be incorporated into the respective target, or added to the plasma. In any case, however, the diffusion barrier layer should be kept free of oxidic components.

The process steps explained in the above example can be carried out in a simple receiver in a consecutive time sequence. But it is also possible to provide a receiver subdivided into chambers and fitted with air-locks between the chambers, in which the individual process steps are to be carried out. For example, one chamber can be provided for degassing of the semi-finished part, next to it a chamber can be provided for cleaning and roughening of the surface to be coated by reverse cathodic sputtering, followed by a third chamber for producing the diffusion barrier layer 3, and a fourth chamber for producing the functional or sliding layer 4. If the layered composite construction material is to be made in the form of a strip, the semi-finished strip can be continuously conveyed into the receiver through an inlet lock, and the strip of layered composite construction material can be continuously withdrawn from the receiver through an outlet lock. Naturally, semi-finished pieces made from the steel carrier 1 and intermediate layer 2 can also be introduced into the receiver successively through an inlet lock and the corresponding pieces of layered composite construction material can be withdrawn successively from the receiver through an outlet lock, while the process sequence is maintained continuously within the receiver.

Variations and modifications are possible without departing from the spirit of the invention.

Each and every one of the appended claims defines an aspect of the invention which is separate and distinct from all others, and accordingly it is intended that each claim be treated in this manner when examined in the light of the prior art devices in any determination of novelty or validity.

Key to accompanying drawings:

1—Carrier layer (steel)
2—Intermediate layer
3—Diffusion barrier layer
4—Sliding layer (functional layer)
5—Crystal lattice in the diffusion barrier layer

What is claimed is:

1. A process for producing a layered composite construction material for sliding and friction members of the type having a substrate layer, comprising: forming an intermediate layer on the substrate layer, forming a diffusion barrier layer on the intermediate layer, and forming a functional layer on the diffusion barrier layer, wherein the diffusion barrier layer is from 0.5 to 5 um thick and consists of a metallic material, characterized by forming said diffusion barrier layer as an essentially cubic face-centered crystal lattice by the steps of cathode sputtering from a target while maintaining the substrate temperature substantially between 120° C. and 200° C., adjusting the plasma pressure to substantially between $10^{-3}$ and $5 \times 10^{-2}$ mbar, and applying a voltage of substantially between 300 and 700 volts between the substrate layer and the target so as to provide a practically vacancy-free recrystallized structure of the cubic face-centered crystal lattice making up the diffusion barrier layer.

2. Process in accordance with claim 1, characterized in that a negative electrical potential is applied to the substrate during the formation of the diffusion barrier layer, which potential is smaller by an order of magnitude than the negative electrical potential applied to the target.

3. Process in accordance with claim 1, characterized in that the heating of the substrate to the temperature desired in the formation of the diffusion barrier layer is carried out by means of the reverse cathodic sputtering for etching the surface of the intermediate layer.

4. Process in accordance with claim 1, characterized in that, during the course of the cathodic sputtering for the formation of the diffusion barrier layer, the substrate and the diffusion barrier layer are post-heated on the side which is to be coated.

5. Process in accordance with claim 1, characterized in that the formation of the diffusion barrier layer is carried out by cathodic sputtering in a magnetic field.

6. Process in accordance with claim 1, characterized in that, immediately after the diffusion barrier layer is applied, the functional layer is applied by cathodic sputtering.

7. Process in accordance with claim 6, characterized in that, when forming the functional layer using a plasma composition different from that used in forming the diffusion barrier layer, a thin protective layer is first applied by cathodic sputtering to the diffusion barrier layer, using a plasma having essentially the same composition as for the formation of the diffusion barrier layer, said protective layer preferably being made of the material intended for the functional layer.

8. Process in accordance with claim 7, characterized in that the target used for formation of the protective barrier layer by cathodic sputtering, is subjected to a pretreatment which brings about degassing.

9. Process in accordance with claim 1, characterized in that the material contained in the target to be used for the formation of the diffusion barrier layer is subjected to a degassing pretreatment.

10. The method as defined in claim 1, wherein the target for the cathode sputtering comprises a nickel-tin alloy having a tin content of at least 10% by weight.

11. The process according to claim 1, in that prior to the application of the diffusion barrier layer to the intermediate layer (2), the intermediate layer (2) is subjected to an etch of its surface by reverse cathodic sputtering in a vacuum, and immediately thereafter the diffusion barrier layer is applied.

* * * * *